(12) United States Patent
Baidya et al.

(10) Patent No.: US 11,468,656 B2
(45) Date of Patent: Oct. 11, 2022

(54) HIERARCHICAL GRAPH-BASED DOMAIN SELECTION ALGORITHM TO IMPROVE DIVERSITY

(71) Applicant: Intel Corporation, Santa Clara, CA (US)

(72) Inventors: Bikram Baidya, Portland, OR (US); Prasad N. Atkar, Portland, OR (US); Vivek K. Singh, Portland, OR (US); Md Ashraful Alam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 16/457,927

(22) Filed: Jun. 29, 2019

(65) Prior Publication Data

US 2019/0325246 A1 Oct. 24, 2019

(51) Int. Cl.
| | |
|---|---|
| *G06V 10/25* | (2022.01) |
| *G06F 16/583* | (2019.01) |
| *G06T 7/11* | (2017.01) |
| *G06F 30/39* | (2020.01) |
| *H01L 21/027* | (2006.01) |
| *H01L 21/762* | (2006.01) |

(52) U.S. Cl.
CPC .......... *G06V 10/25* (2022.01); *G06F 16/5854* (2019.01); *G06F 30/39* (2020.01); *G06T 7/11* (2017.01); *G06T 2207/20021* (2013.01); *G06T 2207/30148* (2013.01); *H01L 21/0274* (2013.01); *H01L 21/76224* (2013.01)

(58) Field of Classification Search
None
See application file for complete search history.

(56) References Cited

U.S. PATENT DOCUMENTS 9,915,879 B2 * 3/2018 Quintanilha ........ G03F 7/70683
2017/0178980 A1 * 6/2017 Owen ................ G01B 9/02098

\* cited by examiner

*Primary Examiner* — David Perlman
(74) *Attorney, Agent, or Firm* — Alliance IP, LLC

(57) ABSTRACT

A method comprising identifying a plurality of non-overlapping coarse domains of a region of interest; selecting a subset of the plurality of coarse domains based on a plurality of first diversity metrics determined for the plurality of coarse domains; identifying a plurality of non-overlapping fine domains of the region of interest, wherein each of the fine domains is a portion of one of the coarse domains of the selected subset of the plurality of coarse domains; selecting a subset of the plurality of fine domains based on a plurality of second diversity metrics determined for the plurality of coarse domains; and providing an indication of the selected subset of the plurality of fine domains.

20 Claims, 9 Drawing Sheets

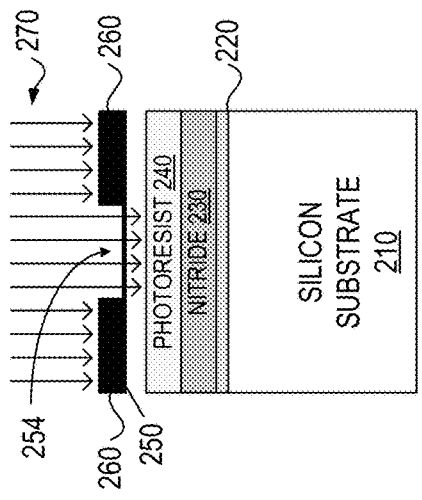
FIG. 2A
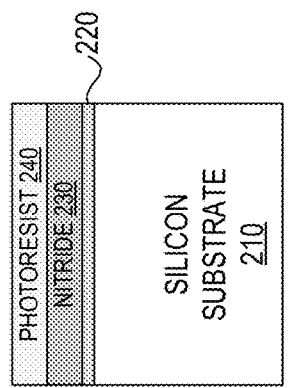
FIG. 2B
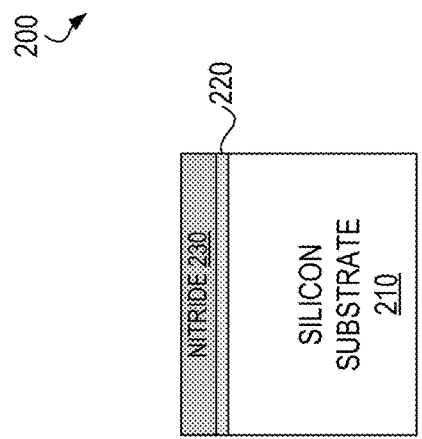
FIG. 2C
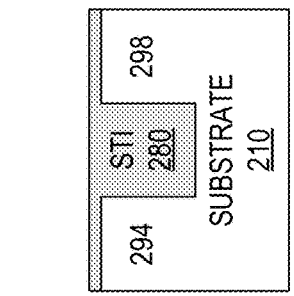
FIG. 2D
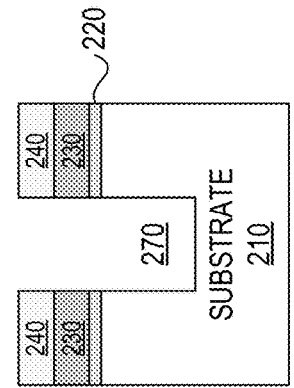
FIG. 2E
FIG. 2F

HIERARCHICAL GRAPH-BASED DOMAIN SELECTION ALGORITHM TO IMPROVE DIVERSITY

TECHNICAL FIELD

This disclosure relates in general to the field of computing systems and, more particularly, to a hierarchical graph-based domain selection algorithm to improve diversity.

BACKGROUND

A region of interest such as a geographic area may be broken up into multiple small regions for detailed examination. For example, an integrated circuit chip may have a large number of features arranged in various patterns. An imaging tool, such as a scanning electron microscope, may be used to capture images of such patterns for analysis, e.g., to improve yield or analyze characteristics of the chip. In general, the size of an image taken by an imaging tool may be very small relative to the area of the chip.

BRIEF DESCRIPTION OF THE DRAWINGS

FIGS. 2A-2F illustrate an exemplary photolithography process in accordance with certain embodiments.

Like reference numbers and designations in the various drawings indicate like elements.

DESCRIPTION OF EXAMPLE EMBODIMENTS

Semiconductor manufacturing has become increasingly complex over the years. Since the turn of the century, the minimum feature size has shrunk by over an order of magnitude as the industry has progressed from 130 nanometer (nm) to 10 nm technology nodes. At the same time, processor complexity has also increased. Current flagship semiconductor products have transistor counts that well exceed 10 billion. To handle these reduced feature sizes and increased chip complexities, companies must invest billions of dollars and years of research of developments efforts to build state-of-the-art fabrication facilities. The industry has done what it can to decrease manufacturing costs by, for example, moving from 200 mm to 300 mm wafers at the 90 nm technology node, but the overall trend requires companies to be willing to pay an increasing price if they want to transition to the next generation of semiconductor manufacturing technology. With up to hundreds of individual dies on a wafer that now spans 12 inches wide, the total number of transistors that can be printed on a wafer is on the scale of one trillion. Developing a high-volume manufacturing process that can reliably manufacture transistors at such an extreme scale presents considerable challenges.

Figure 1A:
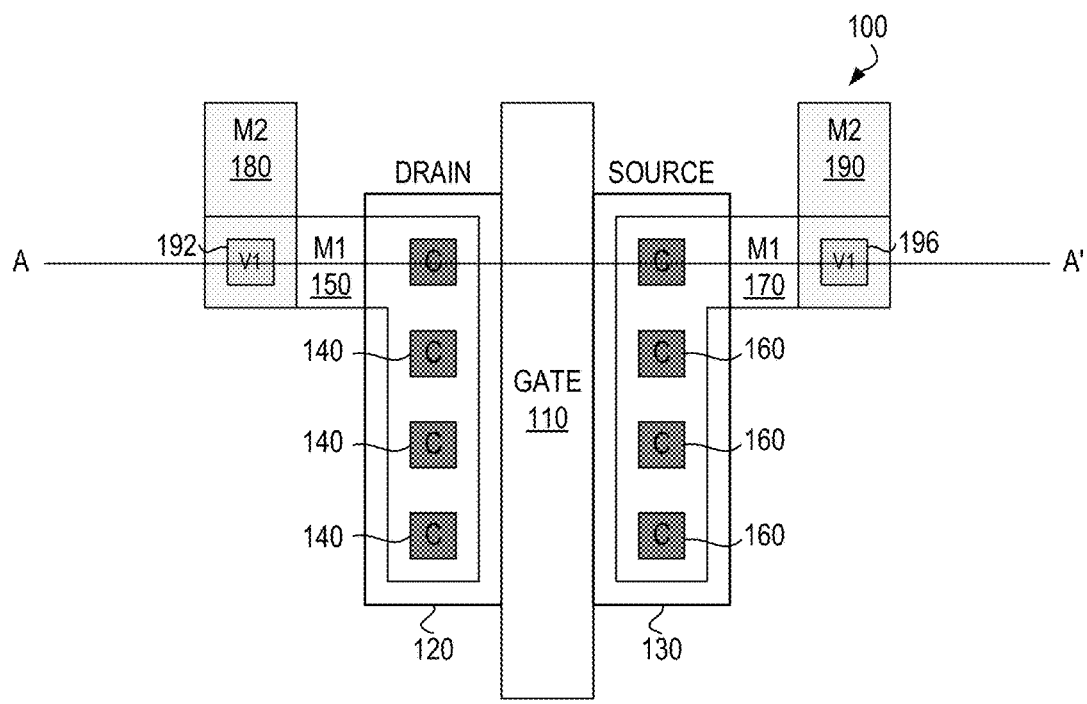
FIG. 1A illustrates the physical design of an exemplary planar transistor in accordance with certain embodiments.

Turning now to FIGS. 1-3, an overview of various aspects of semiconductor device manufacturing is presented. FIG. 1A illustrates the physical design of an exemplary planar transistor. As will be discussed in greater detail below, the physical design of a product is used to generate masks that will be used during manufacturing to print the features on a wafer to implement the product. The physical design is typically a series of polygons drawn at various layers (e.g., gate layer, contact layer, metal-1 layer).

Transistor 100 is a field-effect-transistor (FET), the transistor type used in most modern semiconductor devices. Transistor 100 comprises gate 110, drain 120, and source 130 regions. The gate region in a field-effect transistor can be thought of as an "on-off" switch that controls the flow of current between the drain and source. When gate 110 is "off", there is no (or little) current flowing through the channel region connecting drain 120 to source 130, and when gate 110 is "on", current readily flows through the channel region. Transistor 100 is connected to other transistors by a series of interconnect layers that are stacked vertically on top of transistor 100. Contacts 140 connect drain 120 to segment 150 of a first metal layer (M1), and contacts 160 connect source 130 to M1 segment 170. M1 segments 150 and 170 are in turn connected to second layer metal (M2) segments 180 and 190 by a first level of "vias" (V1) 192 and 196, respectively. In general, metal layer thickness increases as one moves up the interconnect stack, with the thinner, lower-level metals being generally used for local routing of signals, and the thicker, upper-level metals being used for global signal routing and power/ground planes. For simplicity, FIG. 1A only shows two levels of metal. Current semiconductor manufacturing processes may have, e.g., up to ten layers of interconnect.

Figure 1B:
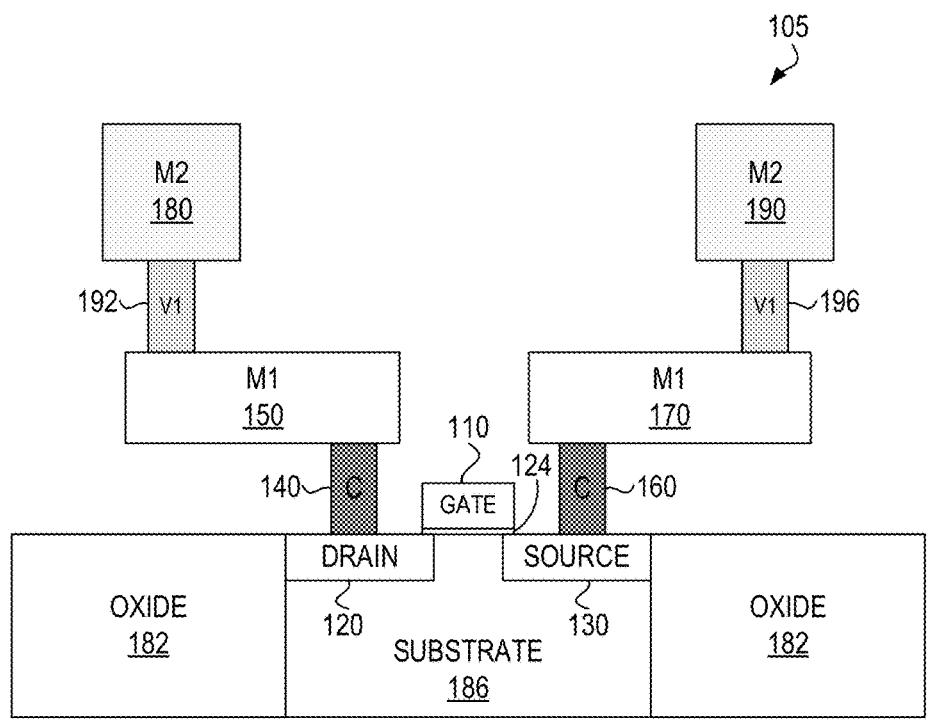
FIG. 1B illustrates an exemplary cross-section of the planar transistor of FIG. 1A taken along the line A-A' in accordance with certain embodiments.

FIG. 1B illustrates an exemplary cross-section of the planar transistor of FIG. 1A taken along the line A-A'. Cross-section 105 shows gate 110 separated from drain 120 and source 130 regions by high-k dielectric layer 124, which electrically insulates gate 110 from drain 120 and source 130 regions. Transistor 100 is in substrate region 186 and is insulated from adjacent transistors by oxide regions 182. The planar transistor illustrated in FIGS. 1A and 1B is just one type of transistor topography, the planar nature of the transistor reflecting that the gate, source, and drain regions are located on or are adjacent to a relatively planar surface. Another type of transistor topography is the non-planar transistor topography used in FinFETS, which are used almost exclusively in cutting-edge manufacturing processes. FinFETS are field-effect transistors that operate under the same general principle as planar FET transistors—a gate controls the flow of current between drain and source regions—with the modification that the gate wraps around a series of "fins" that extend vertically upwards from the wafer surface.

Starting with a "blank" silicon wafer, hundreds of processing steps are performed to build the transistors and interconnects needed to create a finished device. Essential to semiconductor manufacturing is the process of photolithography, by which patterns are transferred from a mask onto a wafer. As previously mentioned, masks are used to define the shape and location of the various features for a processing layer. For example, a first mask can define oxide regions, a second mask can define high-k dielectric regions, a third mask can define source and drain regions, and a fourth mask can define where contacts will be placed. Additional masks may be used to define each metal layer and the intervening via layers.

FIGS. 2A-2F illustrate an exemplary photolithography process. Process 200 illustrates how oxide regions 182 in FIG. 1B can be created using photolithography. In FIG. 2A, a thin silicon dioxide layer 220 is thermally grown across the top of silicon substrate 210. Silicon nitride layer 230, a protective layer, is deposited on top of silicon dioxide layer 220. In FIG. 2B, photoresist 240 is deposited on the wafer. A photoresist is a material whose reactance to an etchant or solvent increases (if a positive photoresist) or decreases (negative photoresist) upon exposure to light. In process 200, photoresist 240 is a positive photoresist. In FIG. 2C, mask 250 with patterns 260 drawn on it is oriented above the substrate 210 and exposed to light 270. The light 270 passes through transparent region 254 of the mask (where no patterns have been drawn) and exposes photoresist 240. Mask regions 260 where patterns have been drawn are opaque to light 270 and the photoresist regions under patterns 260 are not exposed to light 270. In FIG. 2D, photoresist 240 is chemically developed and the regions exposed to light 270 are dissolved. The remaining portions of photoresist 240 can now act as an on-wafer mask to allow for the selective processing of nitride layer 230. In FIG. 2E, the wafer is subjected to an etch step that removes the silicon nitride 230, silicon dioxide layer 230, and a portion of the substrate 210 to create trench 270. In FIG. 2F, the photoresist and nitride layers are removed, and trench 270 is filled with silicon dioxide to create shallow trench isolation (STI) region 280 that serves to keep transistors built in regions 294 and 298 electrically isolated from each other. In a similar manner, metal layer masks where metal will be deposited, gate masks define where high-k dielectric layers will be formed, etc.

As masks may be used to realize features and patterns on a wafer, a semiconductor device design may be reduced to a physical design from which masks can be generated. The physical design of a transistor (such as FIG. 1A), circuit, or processor to be manufactured is often referred to as a "layout." Electronic design automation (EDA) tools allow microprocessor architects and circuit designers to design at levels of abstraction above the physical design level, sparing them from having to spend their days drawing polygons in physical design CAD tools to realize their designs. Architects typically define their designs in a hardware design language (HDL), such as VHDL or Verilog. Once their designs have been verified to perform as desired, physical design can be generated automatically using a library of standard layout cells. Circuit designers often seek performance or functionality not available using standard cells, and typically enter their designs into a schematic capture tool. Once their custom designs are finalized, the circuit schematics are handed off to layout designers who manually craft the custom circuit layouts.

Regardless of whether a physical design is generated automatically or manually, it must conform to a set of layout design rules that has been established for the relevant manufacturing process. Design rules are constraints that the physical design must obey in order to ensure that a product can be manufactured with a high degree of repeatability. Most design rules express a minimum feature width or space, for example: gate width must be greater than or equal to 10 nm, source/drain diffusion enclosure of a contact must be at least 16 nm, the width of a first metal layer trace must be at least 20 nm, the space between metal-1 traces must be at least 20 nm, etc. Design rules represent a trade-off between feature density and manufacturability. Being able to print smaller feature sizes can mean more dies can be packed onto a wafer, which can reduce product cost, but if the process cannot reliably print the smaller features, the resulting reduction in wafer yield can more than offset the cost reduction gained by being able to print more dies on a wafer.

Developing design rules for a new process can be difficult as unexpected difficulties can arise. For example, a feature may not scale as much as expected from the previous technology generation due to unforeseen difficulties with a new processing step, a new tool, or other reasons. As process engineers develop a new manufacturing process, they continually fine-tune the individual processing steps to remove as many defect sources as possible. At some point, the process has been tuned enough that the remaining defects that need to be rooted occur so infrequently that they are difficult to find. Process engineers need to find the occurrence of the rare event during process development so that they can determine whether a tweak to the process can reduce the occurrence of the rare event, or to add a design rule to the design rule set so that physical design arrangements that correlate to the rare event are kept out of the final physical design.

Once a physical design is clear of design rule violations, it is passed to the mask generation phase of the EDA tool flow. The mask generation phase is far from trivial because the minimum feature size that can be printed clearly in a photolithographic process is limited by the wavelength of the light source used, and the large discrepancy between the wavelength of the light ($\lambda$=193 nm) that has been used since the 90 nm technology node and the minimum feature sized demanded by the current technology node (10 nm). In response to this challenge, the semiconductor industry has developed resolution enhancement technologies (RET) to allow for the printing of features well below the light source wavelength. A first set of RET techniques works to increase resolution or depth of focus, and a second set compensates for distortion effect due to printing features with a wavelength larger than the minimum feature desired as well as distortions inherent in deposition, etching, and other process steps. The first set includes techniques such as phase-shift masks and double-patterning, and the second set includes optical proximity correction (OPC).

Figure 3A:
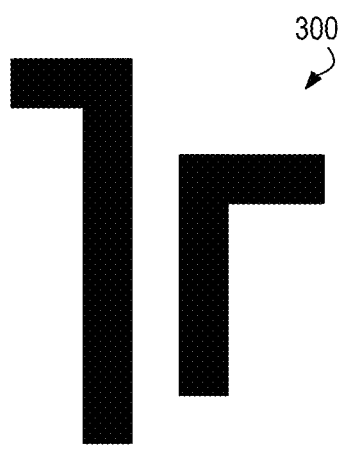
FIGS. 3A-3D illustrate the differences between as-drawn physical design features and as-printed wafer features due to process distortion effects and the use of optical proximity correction to counter those effects in accordance with certain embodiments.
Figure 3B:
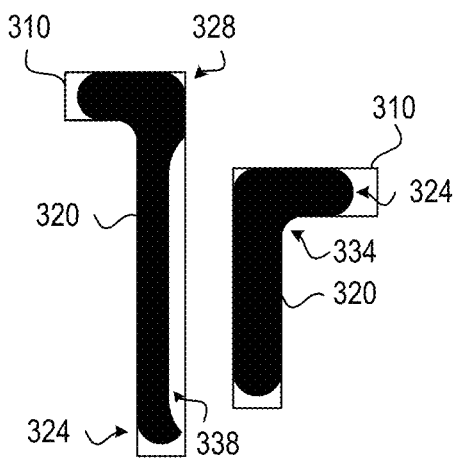
Figure 3C:
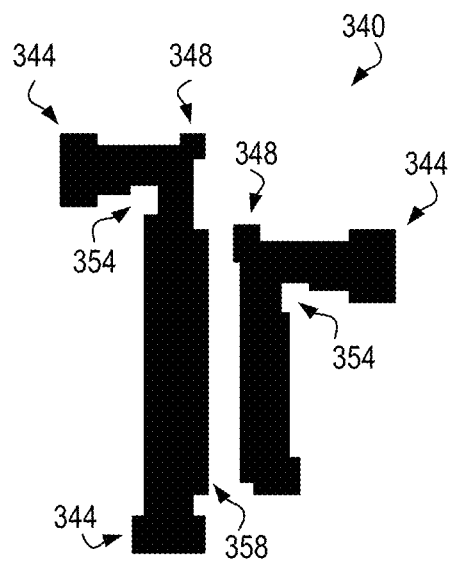
Figure 3D:
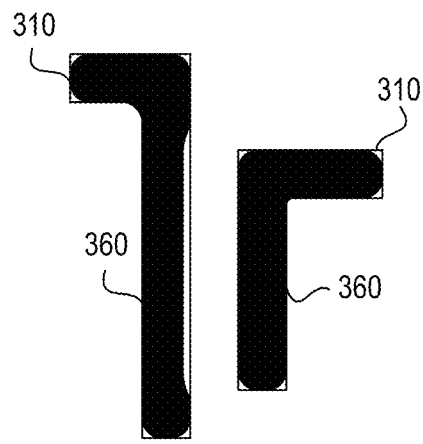

FIGS. 3A-3D illustrate the differences between as-drawn physical design features and as-printed wafer features due to process distortion effects and the use of optical proximity correction to counter those effects. FIG. 3A illustrates two gate polygons 300 in a physical design before being subjected to the OPC process. FIG. 3B illustrates a simplified view of how polygons 300 may appear after being printed on a wafer. Outlines 310 represent the boundaries of original polygons 300 and shapes 320 represents the corresponding as-printed features. Process distortions results in the ends and exterior corners of shapes 320 being rounded off (324, 328), interior corners being filled in (334), and traces being narrowed due to nearby neighboring features (338). FIG. 3C illustrates exemplary modified polygons 340 generated by subjecting original polygons 300 to an OPC process to counter process distortions. Modified polygons 340 are more complicated than original polygons 300. Modified polygons 340 include "dog-bone" features 344 that compensate for end rounding, "ear" features 348 that compensate for corner rounding, "mouse-bite" features 352 that compensate for interior corner rounding, and thickening features 358 that compensate for nearby neighbors. FIG. 3D illustrates a simplified view of how modified shapes 340 may appear after being printed. Outlines 310 again represent the boundaries of original polygons 300. Modification of original polygons by the OPC process results in printed features 360 that are closer to original polygons 300 shapes and sizes. The ends and corners of shapes 360 are less rounded off, the interior corners are less filled in, and the impact of nearby neighbors is diminished.

While OPC generation (and other RET techniques) have allowed minimal feature size to scale with technology node as the wavelength of the photolithographic light source has remained constant, it does not come without its costs. OPC generation is computationally intensive. OPC models, also known as OPC "recipes", can be based on physical models of various processing steps (photolithography, diffusion, etch, deposition, etc.) and attempt to compensate for the distortion of individual mask features, or be rule-based models that generate OPC features based on the layout characteristics (e.g., width, length, and shape of individual features and their nearest-neighbors) without relying on physical models. The application of model based OPC recipes to a complete physical design may involve the application of physical models to over 10 billion shapes at the gate layer alone and to billions of other shapes on other layers. Further, the generation of rule-based OPC recipes, which can be less computationally expensive that model-based OPC recipes, can be an involved process. Generation of rule-based OPC recipes can be based on trial-and-error due to a lack of full understanding of the complex physics and chemistries at play in the development of cutting-edge processing technologies. This trial-and-error can comprise iteratively manufacturing features with many variations of candidate OPC recipes and seeing which recipes produce the best results.

Figure 4:
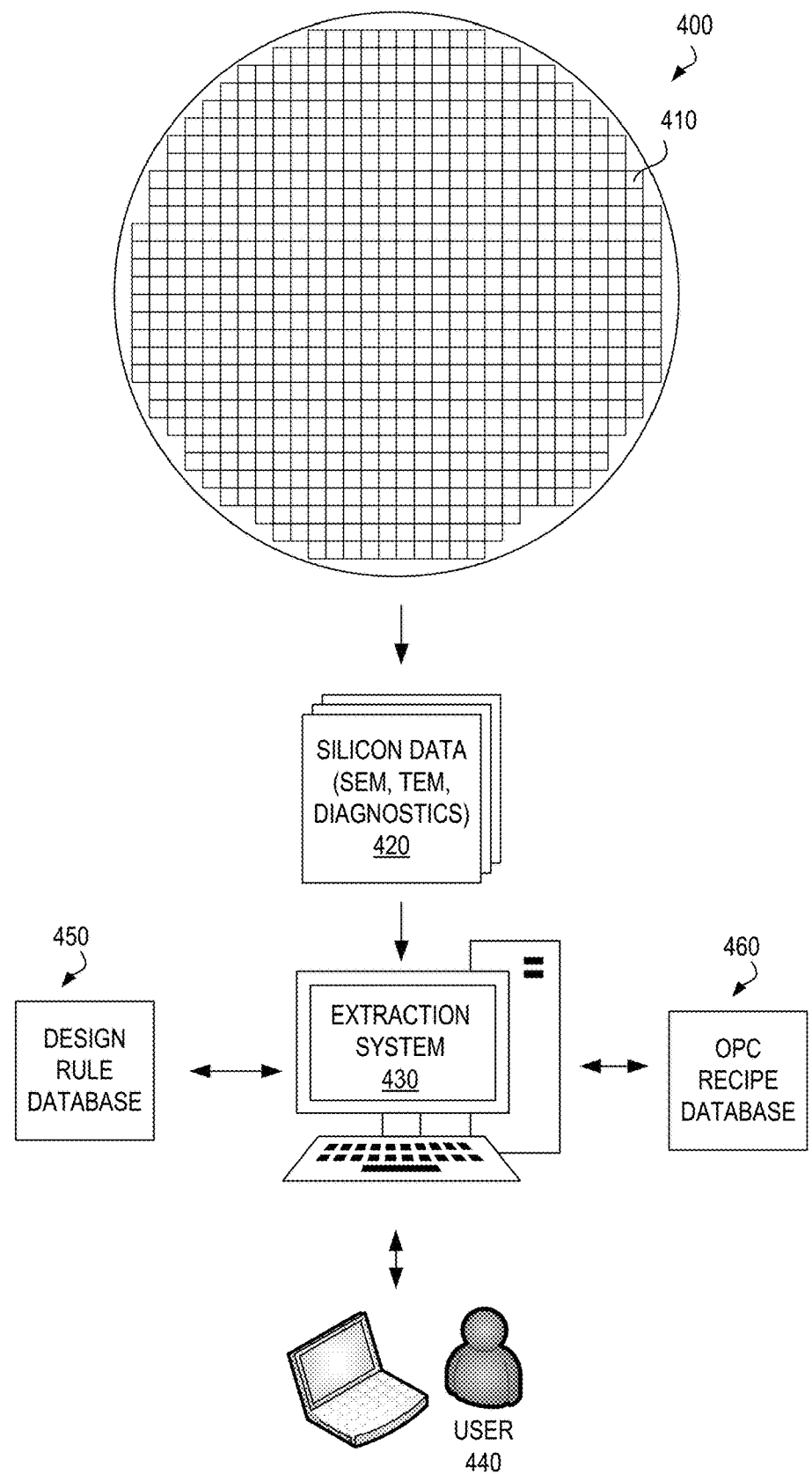
FIG. 4 illustrates a flow for capturing silicon data in a manufacturing process and providing the data to a system employing technologies described herein to aid process development and monitor process health in accordance with certain embodiments.

FIG. 4 illustrates a flow for capturing silicon data in a manufacturing process and providing the data to a system employing technologies described herein to aid process development and monitor process health in accordance with certain embodiments. Silicon wafer 400 comprises dies 410. As discussed earlier, current technology nodes employ 300 mm wafers, meaning a wafer can comprise hundreds of dies. Individual dies are separated by scribe lines that can contain test structures for process development or monitoring process health and that are consumed by the dicing process, whereby a wafer is cut into individual dies. During the manufacture of silicon wafer 400, silicon data 420 can be generated that can be used in the development of a new process or in monitoring the health of an existing one. Silicon data 420 can be any data collected during the manufacturing of wafer 400, such as diagnostic data or images captured by an imaging tool such as a such as a scanning electron microscope (SEM), a transmission electron microscope (TEM), a scanning transmission electron microscope (STEM), or a focus ion beam microscope (FIB). Diagnostic data can include data collected from the scribe line test structures, which can measure electrical properties of various features or layers (e.g., contact or via resistance, metal layer sheet resistance), or indicate the presence of manufacturing defects by testing for shorts between, for example, gate or metal structures having minimum feature sizes or other layout patterns of concern.

Any number of SEM (or other) images can be generated per wafer. SEM images can be taken of one or more portions of an individual die, for various die on the wafer. For example, an SEM image may be taken of the gate layer in a region where the gate patterns are particularly dense (such as in a memory array), and for representative die distributed across the wafer to capture intra-wafer manufacturing processing variations. SEM images can be taken at any point in the manufacturing process. As SEM images can capture a field of view that is, e.g., hundreds of microns in length and width, each image can contain many instances of critical features to be monitored.

Silicon data 420 can be generated for each wafer that is processed during process development or monitoring and can be generated for wafers processed across fabrication facilities in order to evaluate cross-facility manufacturing robustness. Given today's large wafer sizes, the complexities of modern processing technologies, and wafer run rates, the amount of silicon data that can produced can be tremendous. The number of SEM images generated during process development alone can reach into the millions.

Silicon data 420 can be supplied to a semantic pattern extraction system 430 that digests the copious amounts of silicon data and presents to a process engineer or other user 440 information that may useful in process development or improvement. In some examples, the information provided can be semantic patterns (phrases or sentences that are easily understandable by a human) that suggest which physical design parameters or conditions may be responsible for causing a defect. In other examples, the system 430 can determine one or more design rules that could improve process yield and update design rule set 450 for the process or update an OPC recipe database 460 by updating an existing OPC recipe or creating a new OPC recipe that could result in improved yield.

As described above, semiconductor chips may be extremely complex. For example, a chip may have billions of features represented as polygons in many different unique configurations. Images of a semiconductor chip captured by an imaging tool at various processing layers may provide valuable information about the chip. In general, the size of an image captured by the imaging device may be many times (e.g., thousands or tens of thousands) smaller than the chip. While imaging the entire chip at every layer would yield robust and useful data for analysis, the resources and latency required to image the entire chip may be prohibitive.

Figure 5:
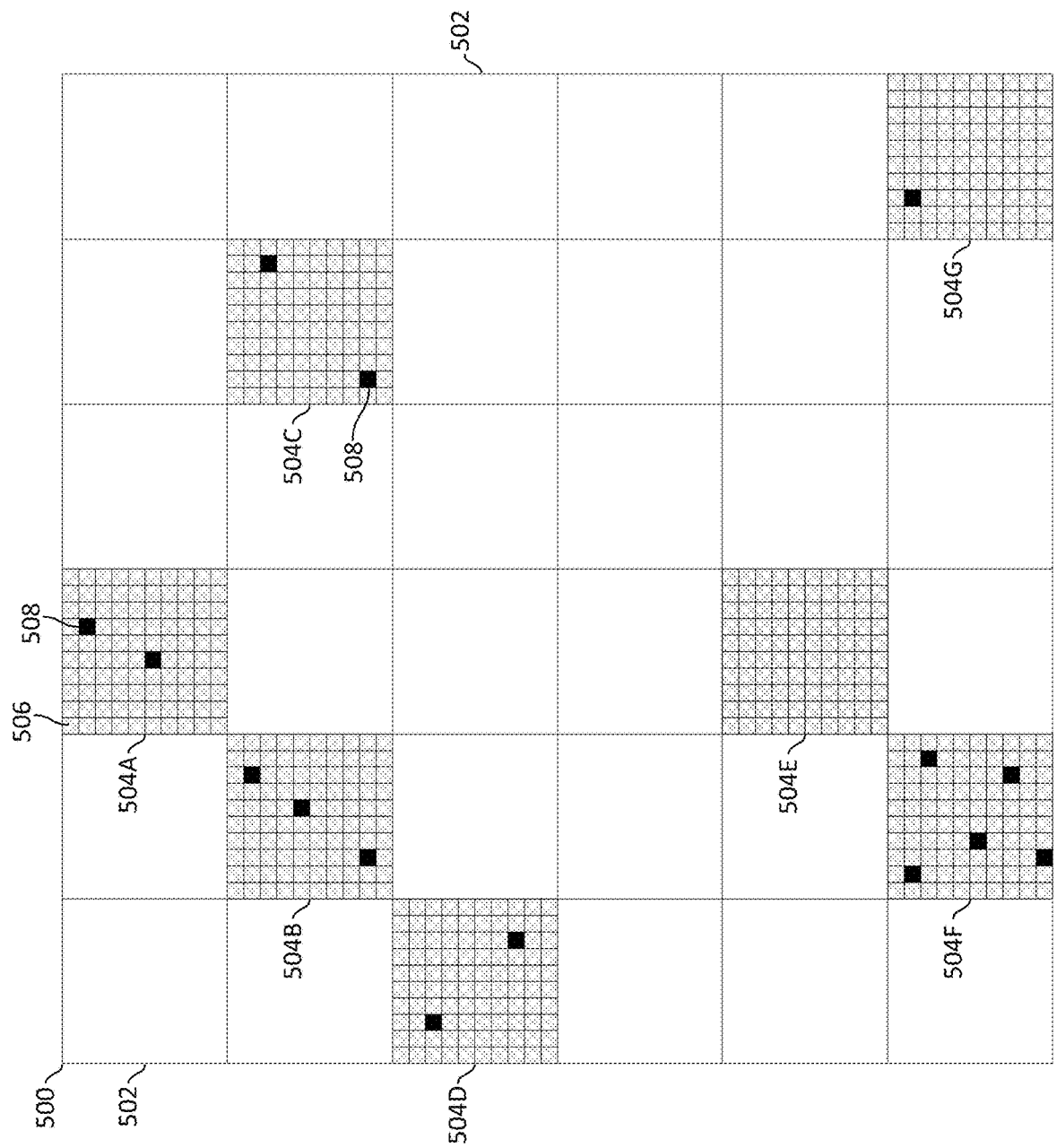
FIG. 5 illustrates a plurality of coarse and fine domains of an integrated circuit chip design in accordance with certain embodiments.

FIG. 5 illustrates a plurality of coarse domains 502 and fine domains 506 of an integrated circuit chip design 500 in accordance with certain embodiments. The coarse domains are depicted in a bird's eye view as large squares and the fine domains are depicted as smaller squares within a subset of the coarse domains. Each domain represents a region of the chip design 500. Coarse domains 502 that are selected for further analysis (as described in further detail below) are depicted in grey and referred to herein as selected coarse domains 504 (e.g., 504A-504G) and fine domains 506 that are selected for further analysis are depicted in black and referred to herein as selected fine domains 508.

Various embodiments described herein strike a balance between the desire for a diverse set of images and limited imaging resources by segmenting the area of the chip (as represented in one or more layout database files defining the layout of the chip) into a plurality of coarse domains (e.g., 502), selecting a subset of the coarse domains (e.g., 504) based on diversity measured within the coarse domains, segmenting the selected coarse domains into fine domains (e.g., 506), and selecting a subset of the fine domains (e.g., 508) based on the diversity characteristics of the fine domains. In a particular embodiment, the size of a fine domain is the same as the size of an image to be captured by an imaging tool (e.g., an SEM) that takes images of the selected fine domains 508 and may be much smaller than the size of a coarse domain (e.g., in some embodiments, a coarse domain 502 may be greater than one hundred times the size of a fine domain 506).

While the discussion below may focus on selecting fine domains for imaging of a semiconductor chip, in a more general sense, various embodiments herein automate the task of identifying a given number of points in a parameter space such that the diversity observed for a specified set of metrics observed over finite neighborhoods of selected points is maximized. The methods and systems described herein are particularly effective when the parameter space available for selection as well as the distinct values in the metrics that need to be covered is very large (e.g., with trillions of combinations of these points and their associated metrics). When optimizing the diversity of values observed for a single metric, the selection problem essentially reduces to a very large set cover problem.

In various embodiments, an approximate but relatively fast set cover algorithm may be run in a distributed mode based on the coarse domains. For example, a master node (e.g., a processor core or other processing element) may distribute analysis of the domains among a plurality of child nodes (e.g., other processor cores or other processing elements). The child nodes (and the master node in some embodiments) may each analyze one or more coarse domains 502 or fine domains 506 and determine diversity metrics for the analyzed domains. The results may be stored in a memory accessible to a node (e.g., the master node or other node) that selects the coarse domains 504 and fine domains 508 having the best diversity metrics.

The selected fine domains 508 may be used to create an inspection sample plan or to perform an informed sampling analysis for a fabricated chip (e.g., the portions of a chip, or multiple chips, corresponding to the selected fine domains 508 may be captured by an imaging device, such as a scanning electron microscope during wafer inspection flows for yield analysis, thus enabling faster process learning). Selecting fine domains 508 using the methods described herein may result in much higher diversity for various metrics relative to random sampling plans. In various embodiments, images corresponding to the selected fine domains 508 may be captured across one or more chips of one or more wafers and included in silicon data 420.

In the embodiment depicted, the coarse domains 502 and fine domains 506 are each depicted in the shape of a square. In other embodiments, the coarse domains 502 and/or the fine domains 506 may have any other suitable shape, such as rectangle, other convex polygon, circle, or other suitable shape. In various embodiments, each of the coarse domains 502 and/or fine domains 506 may have a shape that matches or closely approximates the shape of images of the fabricated chip to be taken by an imaging tool. In one example, the coarse domains 502 or the fine domains 506 may have the same aspect ratio as the images or each other. In some embodiments, the coarse domains 502 may be of different shapes or may have different aspect ratios than the fine domains 506. In various embodiments, one or more of the coarse domains 502 may have a different shape or dimensions than other ones of the coarse domains. For example, coarse domains 502 around the perimeter of the area to be analyzed may be smaller than the other coarse domains 502. Similarly, fine domains 506 may all be of the same size and/or shape or some fine domains 506 may have different sizes or shapes.

In various embodiments, the coarse domains 502 may collectively cover the entire area of one or more layers of the chip design, a substantial majority of one or more layers of the chip design, or other suitable portion of the chip design. In various embodiments, the coarse domains 502 do not overlap with each other and may or may not abut with neighboring coarse domains. Similarly, in various embodiments, the fine domains 506 within a coarse domain 502 may collectively cover the entire area of the coarse domain (or a substantial majority of the coarse domain or other suitable portion of the coarse domain). In various embodiments, the fine domains 506 of a coarse domain 502 do not overlap with each other and may or may not abut with neighboring fine domains.

In various embodiments, the size of a coarse domain 502 or a fine domain 506 may be specified, e.g., by an operator of a computing system analyzing the diversity of the domains or automatically by the computing system. In some embodiments, the specification of the sizes may be based on the processing resources (e.g., memory size or processor bandwidth) available to analyze the domains and/or how diverse the domains are expected to be (e.g., based on past results or other information). For example, if greater diversity is expected, the coarse domains 502 may be configured to be smaller than if less diversity is expected. In some embodiments, the coarse domains are arranged in a grid of equally sized domains across the chip design and the fine domains are arranged in a grid of equally sized domains within each coarse domain.

The coarse domains 502 and fine domains 506 may be defined with respect to a representation of an integrated circuit chip as defined by one or more layout database files defining the geography of the layers of the chip. The one or more layout database files may provide a representation of the chip in terms of planar geometric shapes (e.g., polygons) corresponding to patterns of, e.g., metal, oxide, or semiconductor layers of the chip. A layout database file may represent the physical placement of various devices on the chip. Such a file may specify the presence or absence of various features on different mask layers for masks used to produce the chip. Thus, in a particular embodiment, each coarse and fine domain may encompass a particular portion of a layout database file that corresponds to a particular geographical area of one or more layers of the chip. Any suitable database file format may be used for the layout, such as Graphic Data System II (GDS II), Open Artwork System Interchange Standard (OASIS), or other suitable format.

In a particular embodiment, a subset of the coarse domains 502 and a subset of the fine domains 506 may be selected for a particular layer (or group of adjacent layers) of the chip represented by the layout database file and different coarse domains 502 or fine domains 506 may be selected for a different layer (or group of adjacent layers) of the chip. For example, the diversity present or desired for a particular layer of the chip may be different from the diversity present or desired for a different layer of the chip. Thus, the selection process described herein may be performed multiple times for the same chip design, e.g., depending on how many layers are to be imaged. In another embodiment, the selected coarse domains 504 and fine domains 508 may be selected once for all of the layers of the chip based on their diversity characteristics across all of the layers and groups of multiple layers analyzed. In another embodiment, one selection may be used for single layers of a plurality of layers of the chip and another selection may be used for other layers of the chip.

Figure 6:
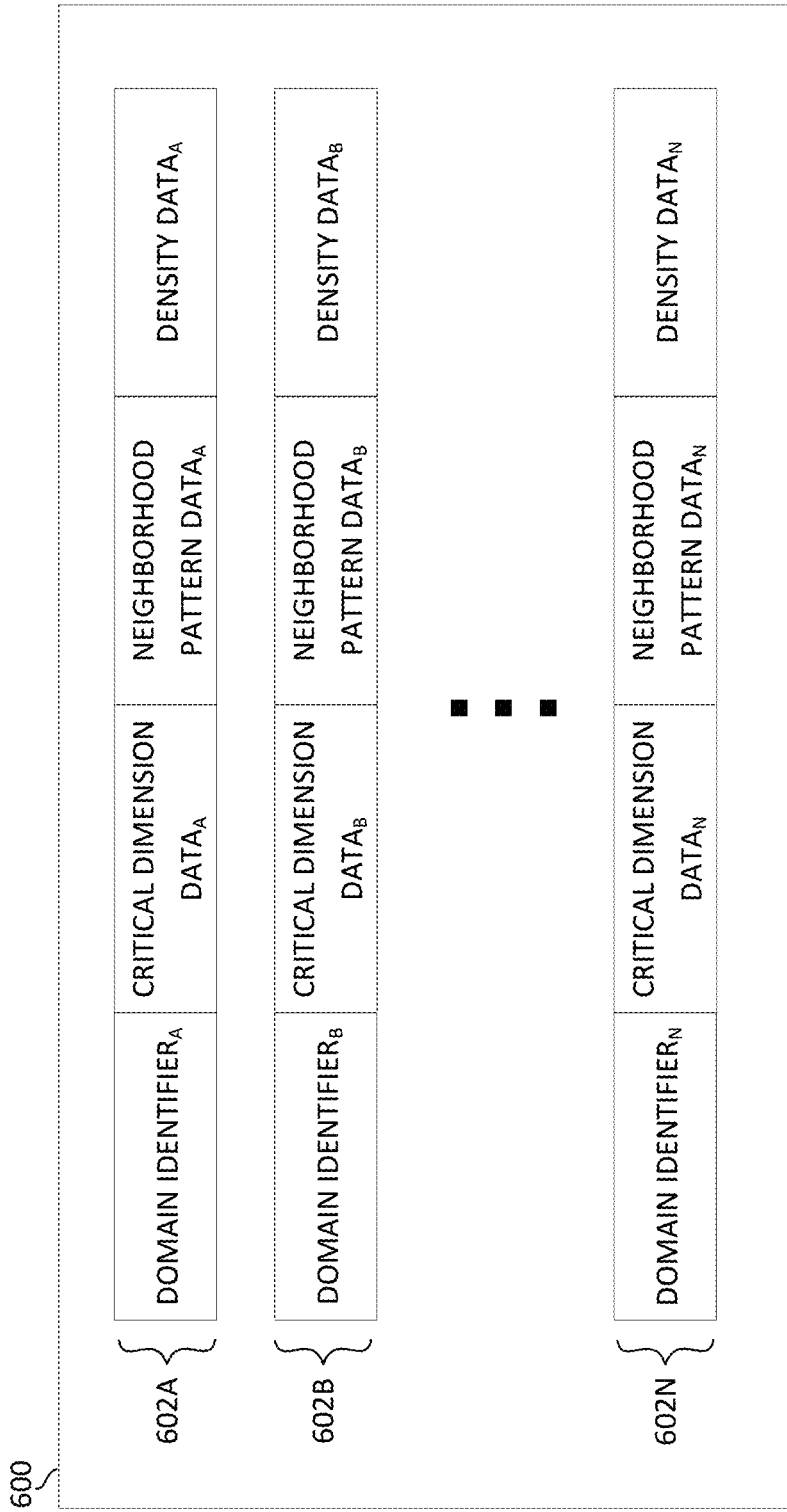
FIG. 6 illustrates metric data that may be analyzed for coarse and fine domains in accordance with certain embodiments.

FIG. 6 illustrates a set 600 of metrics that may be analyzed for coarse and fine domains in accordance with certain embodiments. In various embodiments, any one or more metric types (including those depicted or other metric types) may be analyzed for diversity.

A collection of data 602 (e.g., 602A-602N) may be generated for each domain analyzed. In the embodiment depicted, each collection 602 includes critical dimension data, neighborhood pattern data, and density data. In the embodiment depicted, each data collection 602 is associated with a domain identifier (which may be explicitly stored with or otherwise associated with the respective data collection) that provides a unique identification for the coarse or fine domain being analyzed. In various embodiments, a domain identifier may be associated with the boundaries of the domain in any suitable manner to correlate metrics of a domain with a particular geographic area of the chip.

The information collected for a particular metric may have any suitable format. For example, the information may include a count of occurrences for a plurality of different values of the metric (e.g., each possible value) of the metric. As another example, the information may include a count of occurrences for each of a plurality of ranges of values of the metric. In some embodiments, the ranges may be set based on expected values for the metric and/or the expected diversity for the values. In some embodiments, the ranges may be adaptive and may change as the domain is analyzed. In another example, the information may include other statistical metrics (e.g., an average of values) over the entire domain or a plurality of statistical metrics, each corresponding to a portion of the domain. Other suitable formats for the information may be utilized.

In a particular embodiment, a collection of data 602 is collected for each fine domain 506 across the entire chip design. For example, collections of data 602 may be collected for the fine domains 506 of every coarse domain 502 (not just the depicted selected coarse domains 504). The collections of data of the fine domains of the coarse domains 602 are then aggregated to generate the collection of data for the coarse domains 602. For example, the collections of data for the fine domains 506 of a first coarse domain are aggregated to determine the collection of data for the first coarse domain, the collections of data for the fine domains 506 of a second coarse domain are aggregated to determine the collection of data for the first coarse domain, and so on. Aggregating these collections of data of fine domains to form a collection of data for a coarse domain may involve summing up counts of metric values or value ranges, averaging metric values or value ranges, or otherwise combining statistical metrics of the fine domains.

In various embodiments, generation of the collections of data 602 for the fine domains 504 may be distributed among multiple processing elements as alluded to above. Each processing element may then communicate its generated collections of data 602 into a common memory accessible to a master processing element that aggregates the collections of data 602 of the fine domains into collections of data for the coarse domains. Alternatively, the distributed processing elements may each generate the collections of data 602 for all of the fine domains of a respective coarse domain, generate the collection of data 602 for the coarse domain based on the collections of data 602 of the fine domains, and then pass the collection of data 602 for the coarse domain and the collections of data 602 for the fine domains to the common memory for use in selecting the coarse domains 504 and fine domains 508.

Critical dimension data may include information associated with one or more critical dimensions of polygons of the chip design. A critical dimension may be, e.g., a width (e.g., size in an x direction) or height (e.g., size in a y direction) of a particular polygon when viewed in a 2D representation. In one embodiment, for particular polygon types, the critical dimension data may include counts for each unique combination of width and height, where each count represents the number of polygons in the domain having the particular width and height. In another embodiment, for particular polygon types (e.g., a metal line), the critical dimension data may include counts for one dimension (e.g., each unique width). In another embodiment, the critical dimension data may include counts for each unique ratio of width and height, where each count represents the number of polygons in the domain having the particular width/height ratio.

Neighborhood pattern data may include information about inter-polygon relationships. For example, neighborhood pattern data may include information regarding the relative placement of one or more polygons with respect to a particular polygon. For example, the relative placement may indicate the distance, size, and/or direction of one or more other polygons from a particular polygon (referred to as an anchor polygon) within a particular window size which may have any suitable shape (e.g., square, other rectangle, circle, or other shape). In some embodiments, a neighborhood pattern may be defined by an anchor polygon and zero or more polygons within a window around the anchor polygon. The neighborhood patterns may be defined in any suitable manner with respect to the various layers. For example, some neighborhood patterns may consider only polygons in the same layer as the anchor polygon, while other neighborhood patterns may consider polygons within multiple layers. In a particular embodiment, neighborhood pattern data may include a plurality of counts with each count corresponding to an anchor polygon and a unique neighborhood pattern and indicating the number of instances of that anchor polygon in connection with the exact neighborhood pattern within the domain. In another embodiment, neighborhood pattern data may include a plurality of counts with each count corresponding to an anchor polygon and a unique neighborhood pattern around the anchor polygon and indicating the number of instances of that anchor polygon in connection with a neighborhood that is similar to the unique neighborhood pattern (e.g., above a threshold measuring the similarity by using fuzzy mapping). In some embodiments, the counts for multiple different window sizes may be generated. For example, for a particular anchor polygon, the neighborhood pattern data may include counts for similar neighborhood patterns of a first window size and counts for similar neighborhood patterns of a second window size. Neighborhood pattern data may additionally or alternatively include metrics based on any of these counts.

Density information may include densities of polygons of one or more layers within one or more regions of the domain. For example, for a particular region, the density may represent a ratio of area covered by one or more polygons within the region to the area of the particular region. In various embodiments, each density may be calculated with respect to an anchor polygon and a region comprising a window (which may have any suitable size or shape) around the anchor polygon. In some embodiments, the density information of a domain may include counts where each count corresponds to an anchor polygon and a number of instances of density values within a range of density values. In other embodiments, the density information may include any suitable metrics associated with densities measured for various anchor polygons. In some embodiments, the density information for multiple different window sizes may be generated. For example, for a particular anchor polygon, the density of a first window size around the anchor polygon and the density of a second window size around the anchor polygon may be determined and included within the density information (or metrics based on such densities may be included within the density information). Density data may additionally or alternatively include metrics based on any of the information described above.

Analysis of critical dimensions, neighborhood patterns, and densities around polygons may provide particularly useful insight into the relationship between the designed features and the corresponding fabricated features. In combination, these three metric types allow for a holistic view of the resulting polygons and their different behaviors.

Additionally or alternatively, data collection 602 may include any other information of any suitable metric type, such as areas of polygons or groups of polygons, distances between polygons or groups of polygons, electrical characteristics derived from polygon patterns, thermal characteristics derived from polygon patterns, or other suitable metrics (e.g., that may be attributed to geometric distribution of the patterns).

Figure 7:
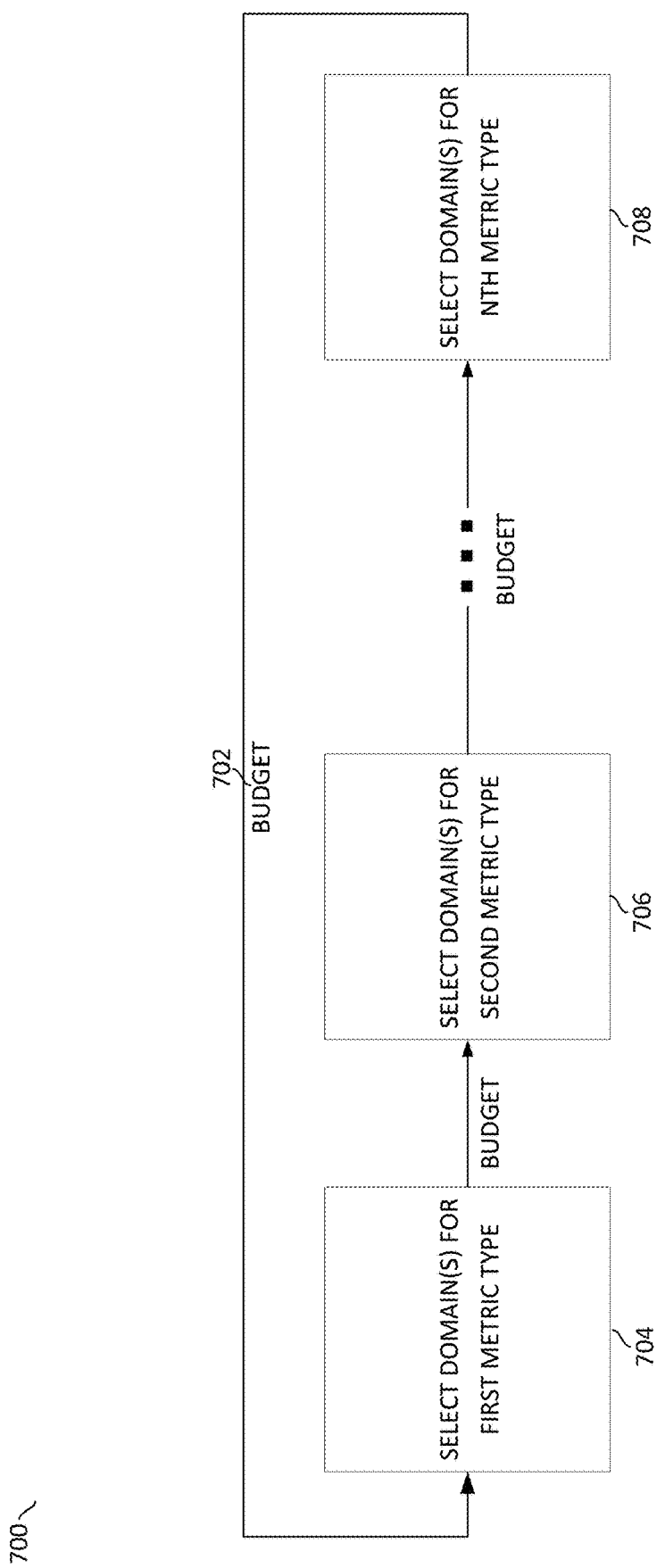
FIG. 7 illustrates a flow for selecting domains to improve diversity based on a budget in accordance with certain embodiments.

FIG. 7 illustrates a flow 700 for selecting domains to improve diversity based on a budget in accordance with certain embodiments. The flow 700 may be performed for one or both of coarse domains 502 and fine domains 506. For example, the flow 700 may be performed to select coarse domains 504 and then performed again (with the same or different parameters) to select fine domains 508.

The flow 700 may operate based on a budget 702 that provides information used to determine the number of domains to be selected. In some embodiments, the budget 702 may also include information providing guidance regarding which domains to select. The budget 702 may be specified by any suitable entity and based on any suitable information such as the computing, power, or time resources available for backend analysis of the selected fine domains (e.g., for imaging).

In one embodiment, budget 702 specifies a fixed number of domains to be selected. In other embodiments, the number of domains to be selected may be variable. For example, domain selection may continue until an adequate measure of diversity is achieved among the selected domains (the adequacy of diversity may be defined relative to any one or more metrics of the chip design, such as those described above or other suitable metrics).

In some embodiments, the budget 702 may be determined based on the statistics gathered during analysis of the chip design to generate the data collections 602. For example, the metrics analyzed may indicate the number of unique values of samples for one or more metrics (e.g., the first metric, second metric, etc.) and/or the number of samples for each of a plurality of unique values of metrics. As an example, the data collections 602 of the coarse domains may provide an exact determination or estimation of the number of distinct neighborhood patterns for one or more polygons, distinct values of critical dimensions of polygons (and the number of polygons having each value), and densities for associated with one or more polygons.

In some embodiments, the budget 702 may specify a portion of the unique values (or ranges) and/or samples available on the chip that should be included within the selected domains. For example, the budget 702 may specify that for each unique value (or range) of a metric type, half of the total samples of each unique value (or range) are to be included by the selected domains. As another example, the budget 702 may specify a number of samples to be included for each unique value (or range) of a metric type. As yet another example, the budget 702 may specify a number of samples to be included for a particular percentage of the unique values (or ranges). In various embodiments, the number or portion of samples specified in the budget 702 for a particular value of a metric may be different from the number or portion of samples specified for a different value of the metric (or for a different metric). In a particular embodiment, the budget 702 used for selection of the coarse domains 504 may be different than a budget used for selection of the fine domains 508 (e.g., the number of samples for values or ranges of the metrics may be different).

Flow 700 represents a flow for improving the diversity for multiple different metric types. For multi-objective optimization where the observed diversity is maximized for multiple metric types, an iterative algorithm is used to optimize coverage across these multiple metric types. A metric type may refer to a broad type of metric that may be gathered (e.g., critical dimensions, neighborhood patterns, or densities) or to a subgroup thereof (e.g., critical dimensions of certain sizes of polygons, neighborhood patterns associated with a particular anchor polygon or group of anchor polygons, etc.).

At 704, one or more domains are selected for a first metric type (e.g., based on metrics indicating the relative diversity of the domains). In some embodiments, at 704, the domain(s) with the highest diversity for the first metric type is selected. For example, a domain that includes the highest number of unique values or ranges of a particular metric may be selected. As another example, a domain that includes the highest number of samples for unique values or ranges of the first metric may be selected. In some embodiments, a domain that is closest to approximating the probabilistic distribution of samples of the first metric across the entire chip design is selected. For example, if 20% of the chip is low density and 80% is high density, a coarse domain that has a distribution close to 20% low density regions and 80% high density regions is selected.

Once one or more domains have been selected for the first metric type at 704, the samples of the metric values present in the selected domains are filtered from the budget 702. This filtering may apply not only to samples of the first metric type, but also to samples of any other metric types specified in the budget (e.g., the second metric type). Thus, if the budget specifies one thousand samples of a certain type of polygon having width X and five hundred samples of a particular neighborhood pattern and the first domain selected includes four hundred samples of the polygon with width X and one hundred samples of the particular neighborhood pattern, the budget may be reduced to six hundred samples of the polygon with width X and four hundred samples of the neighborhood pattern. The budget is updated for future selections.

In various embodiments, once a budgeted number of samples of a particular value or range of a metric among the selected domains is surpassed, additional instances of the value or range for the metric do not improve the diversity of the domain. For example, if the budget for a certain type of polygon having a width of X is one thousand, once the number of such polygons present in the selected domains reaches one thousand, additional such polygons in the domains being considered for selection do not improve the diversity score of such domains. Thus, in some embodiments, the flow 700 may attempt to identify domains that have a sufficient number of samples of a high number of different values or ranges of the first metric type.

After one or more domains have been selected for the first metric type, the flow may move to 706, in which one or more domains are selected for the second metric type (after a determination that additional budget is available to select one or more domains). The one or more domains may be selected in any suitable manner, including any of those manners described above. After one or more domains are selected for the second metric type, the samples of the metric values present in the selected domains are filtered from the budget 702. The budget is then passed on for the next selection.

The flow 700 may continue in this manner for any number of metrics. At 708, one or more domains are selected for the Nth metric type (where N is any suitable integer) after a determination that additional budget is available to select one or more domains. The one or more domains may be selected in any suitable manner, including any of those manners described above. After one or more domains are selected for the Nth metric, the samples of the metric values present in the selected domains are filtered from the budget 702. The budget is then passed on for the next selection. Assuming additional budget for selecting domains is available, the flow may return to 704, where another one or more domains are selected for the first metric. The flow may continue until the number of domains selected is equal to a limit of domains set in the original budget 702 or until the desired amount of diversity is achieved (which in some situations may be achieved before the limit of domains is reached).

In a particular embodiment, one domain may be selected at each selection iteration (e.g., 704, 706, etc.) for each metric type, such that each metric type has a single domain selected before an additional domain is selected for any of the metric types. In another embodiment, two domains (or three domains or other number of multiple domains) may be selected at each selection instance for the metric types. In some embodiments, different budgets may be set for different metric types. For example, if diversity of the first metric type is particularly desirable, a larger number of domains may be selected at iteration 704 than at 706. In any of these embodiments, additional domains may be selected for the metric types after domains have been selected for each metric type. In some embodiments, the selection order is not successive. For example, one or more domains may be selected for the first metric type, then one or more domains may be selected for the second metric type, then another one or more domains selected for the first metric type, then one or more domains selected for the third metric type, and so on.

In some embodiments, all domains to be selected for the first metric type may be selected before any domains are selected for the second metric type (or any other metric type). For example, the budget 702 may specify a limit of a number of domains for a first metric type and/or a desired diversity coverage for the first metric type. Domains may then be selected for the first metric type until the limit of the number of domains is reached or until the desired diversity coverage is reached.

The flow may be similar when domains are selected for a single metric type (instead of a multi-objective optimization). For example, the domains may be analyzed and the domain having the most diversity may be selected. The samples of the metric values present in the selected domains are filtered from the budget. From the domains remaining, the domain having the best diversity is selected. The flow continues in like manner until a limit on the number of domains or a desired diversity coverage is reached.

Figure 8:
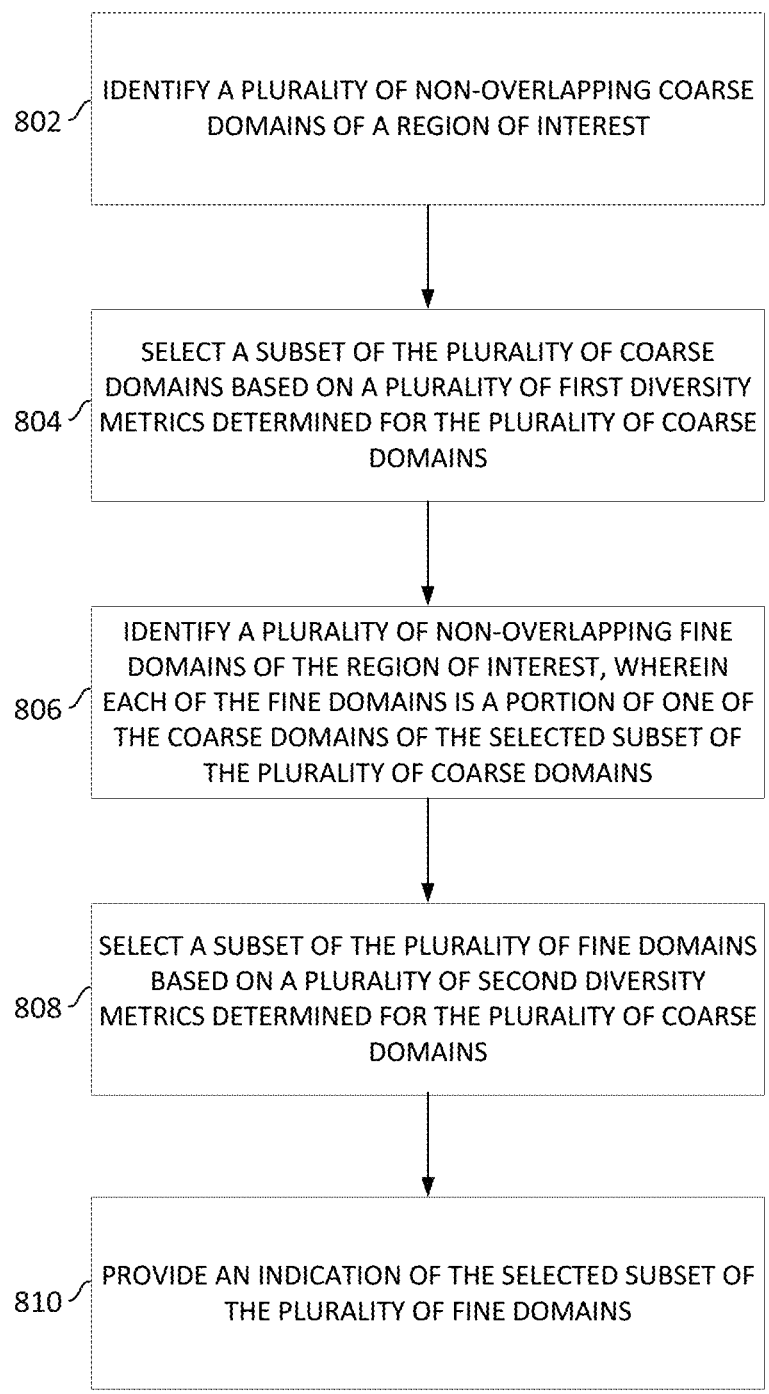
FIG. 8 illustrates a flow for hierarchical graph-based domain selection to improve diversity in accordance with certain embodiments.

FIG. 8 illustrates a flow for hierarchical graph-based domain selection to improve diversity in accordance with certain embodiments. The flow may be performed by any suitable computing system, such as computing system 900 of FIG. 9.

At 802, a plurality of non-overlapping coarse domains of a region of interest are identified. At 804, a subset of the plurality of coarse domains is selected based on a plurality of first diversity metrics determined for the plurality of coarse domains, wherein each first diversity metric represents a measure of the diversity of values of at least one metric type for one of the plurality of coarse domains. At 806, a plurality of non-overlapping fine domains of the region of interest are identified, wherein each of the fine domains is a portion of one of the coarse domains of the selected subset of the plurality of coarse domains. At 808, a subset of the plurality of fine domains is selected based on a plurality of second diversity metrics determined for the plurality of coarse domains, wherein each second diversity metric represents a measure of the diversity of values of the at least one metric type for one of the plurality of fine domains. At 810, an indication of the selected subset of the plurality of fine domains is provided.

Although the examples above focus on selection of domains for a chip design, the teachings herein may be applied to any other suitable application. For example, a merchant may have limited floor space and may desire to set up a diverse set of books, but may have a vast set of books to choose from. The genres of books or types of authors may be the metrics on which diversity is calculated. The popularity of a particular genre of book may instruct the number of books of that genre that are to be included in the desired diversity coverage.

As another example, a diverse sample of the population may be desired for government policy decision making. The diversity may be measured along various aspects, such as economic situations, religious beliefs, geographical locations, etc. In order to obtain diversity, the flow above may be followed to select geographic areas or other groups of populations.

Figure 9:
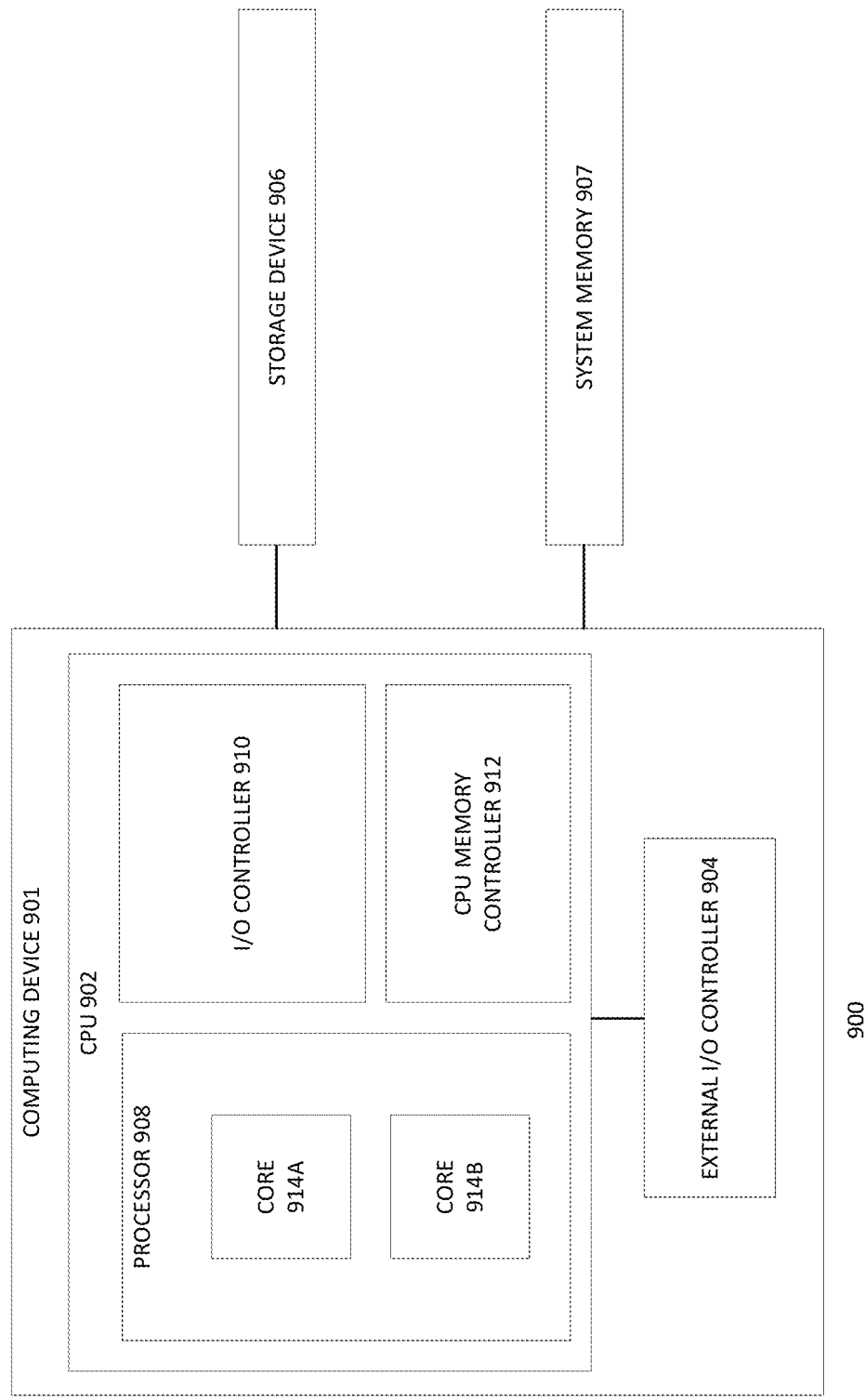
FIG. 9 illustrates a computing system in accordance with certain embodiments.

FIG. 9 illustrates a computing system 900 in accordance with certain embodiments. Any suitable components of system 900 may be used to perform any of the functions described above in connection with FIGS. 4-8. For example, any of the blocks illustrated in these flows or other functions described herein may be performed by a module dedicated to the block or function or a module that performs multiple of the blocks or functions. In some embodiments, extraction system 430 or a computing system utilized by a user 440 to communicate with extraction system 430 may implement one or more components of system 900. System 900 includes a computing device 901 comprising a central processing unit (CPU) 902 coupled to an external input/output (I/O) controller 904, storage device 906, and system memory 907.

During operation, data may be transferred between storage device 906 or system memory 907 and the CPU 902. In various embodiments, particular data operations (e.g., erase, program, and read operations) involving a storage device 906 or system memory 907 may be managed by an operating system or other software application executed by processor 908.

CPU 902 comprises a processor 908, such as a microprocessor, an embedded processor, a digital signal processor (DSP), a network processor, a handheld processor, an application processor, a co-processor, a system on a chip (SOC), or other device to execute code (i.e., software instructions). Processor 908, in the depicted embodiment, includes two processing elements (cores 914A and 914B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 914 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 910 is an integrated I/O controller. In various embodiments, I/O controller 910 may include any one or more characteristics of memory controller 110. I/O controller 910 may include logic for communicating data between CPU 902 and I/O devices, which may refer to any suitable devices capable of transferring data to and/or receiving data from an electronic system, such as CPU 902. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 906 that may be coupled to the CPU 902 through I/O controller 910.

An I/O device may communicate with the I/O controller 910 of the CPU 902 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 910 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 902) or may be integrated on the same chip as the CPU 902.

CPU memory controller 912 is an integrated memory controller. In various embodiments, CPU memory controller 912 may include any one or more characteristics of memory controller 110. CPU memory controller may include logic to control the flow of data going to and from one or more system memories 907. CPU memory controller 912 may include logic operable to read from a system memory 907, write to a system memory 907, or to request other operations from a system memory 907. In various embodiments, CPU memory controller 912 may receive write requests from cores 914 and/or I/O controller 910 and may provide data specified in these requests to a system memory 907 for storage therein. CPU memory controller 912 may also read data from a system memory 907 and provide the read data to I/O controller 910 or a core 914. During operation, CPU memory controller 912 may issue commands including one or more addresses of the system memory 907 in order to read data from or write data to memory (or to perform other operations). In some embodiments, CPU memory controller 912 may be implemented on the same chip as CPU 902, whereas in other embodiments, CPU memory controller 912 may be implemented on a different chip than that of CPU 902. I/O controller 910 may perform similar operations with respect to one or more storage devices 906.

The CPU 902 may also be coupled to one or more other I/O devices through external I/O controller 904. In a particular embodiment, external I/O controller 904 may couple a storage device 906 to the CPU 902. External I/O controller 904 may include logic to manage the flow of data between one or more CPUs 902 and I/O devices. In particular embodiments, external I/O controller 904 is located on a motherboard along with the CPU 902. The external I/O controller 904 may exchange information with components of CPU 902 using point-to-point or other interfaces. In various embodiments, external I/O controller 904 may include any one or more characteristics of memory controller 110.

A system memory 907 may store any suitable data, such as data used by processor 908 to provide the functionality of computer system 900. For example, data associated with programs that are executed or files accessed by cores 914 may be stored in system memory 907. Thus, a system memory 907 may include a system memory that stores data and/or sequences of instructions that are executed or otherwise used by the cores 914. In various embodiments, a system memory 907 may store persistent data (e.g., a user's files or instruction sequences) that remains stored even after power to the system memory 907 is removed. A system memory 907 may be dedicated to a particular CPU 902 or shared with other devices (e.g., one or more other processors or other devices) of computer system 900.

In various embodiments, a system memory 907 may include a memory comprising any number of memory arrays, a memory device controller (In various embodiments, the memory device controller may include any one or more characteristics of memory controller 110), and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMS), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 907 that is volatile memory can comply with JEDEC standards including but not limited to Double Data Rate (DDR) standards, e.g., DDR3, 4, and 5, or Low Power DDR4 (LPDDR4) as well as emerging standards.

A storage device 906 may store any suitable data, such as data used by processor 908 to provide functionality of computer system 900. For example, data associated with programs that are executed or files accessed by cores 914A and 914B may be stored in storage device 906. Thus, in some embodiments, a storage device 906 may store data and/or sequences of instructions that are executed or otherwise used by the cores 914A and 914B. In various embodiments, a storage device 906 may store persistent data (e.g., a user's files or software application code) that remains stored even after power to the storage device 906 is removed. A storage device 906 may be dedicated to CPU 902 or shared with other devices (e.g., another CPU or other device) of computer system 900.

In various embodiments, storage device 906 includes a storage device controller and one or more memory modules. In various embodiments, the storage device controller may include any one or more characteristics of memory controller 110. In various embodiments, a memory module of storage device 906 comprises one or more NAND flash memory arrays, one or more hard disk drives, or other suitable memory storage devices. Storage device 906 may comprise any suitable type of memory and is not limited to a particular speed, technology, or form factor of memory in various embodiments. For example, a storage device 906 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 900 may include multiple different types of storage devices. Storage device 906 may include any suitable interface to communicate with CPU memory controller 912 or I/O controller 910 using any suitable communication protocol such as a DDR-based protocol, PCI, PCIe, USB, SAS, SATA, FC, System Management Bus (SMBus), or other suitable protocol. A storage device 906 may also include a communication interface to communicate with CPU memory controller 912 or I/O controller 910 in accordance with any suitable logical device interface specification such as NVMe, AHCI, or other suitable specification. In particular embodiments, storage device 906 may comprise multiple communication interfaces that each communicate using a separate protocol with CPU memory controller 912 and/or I/O controller 910.

In some embodiments, all, or some of the elements of system 900 are resident on (or coupled to) the same circuit board (e.g., a motherboard). In various embodiments, any suitable partitioning between the elements may exist. For example, the elements depicted in CPU 902 may be located on a single die (i.e., on-chip) or package or any of the elements of CPU 902 may be located off-chip or off-package. Similarly, the elements depicted in storage device 906 may be located on a single chip or on multiple chips. In various embodiments, a storage device 906 and a computing device (e.g., CPU 902) may be located on the same circuit board or on the same device and in other embodiments the storage device 906 and the computing device may be located on different circuit boards or devices.

The components of system 900 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 900, such as cores 914, one or more CPU memory controllers 912, I/O controller 910, integrated I/O devices, direct memory access (DMA) logic (not shown), etc. In various embodiments, components of computer system 900 may be coupled together through one or more networks comprising any number of intervening network nodes, such as routers, switches, or other computing devices. For example, a computing device (e.g., CPU 902) and the storage device 906 may be communicably coupled through a network.

Although not depicted, system 900 may use a battery and/or power supply outlet connector and associated system to receive power, a display to output data provided by CPU 902, or a network interface allowing the CPU 902 to communicate over a network. In various embodiments, the battery, power supply outlet connector, display, and/or network interface may be communicatively coupled to CPU 902. Other sources of power can be used such as renewable energy (e.g., solar power or motion based power).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parseable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to circuitry and any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 902, external I/O controller 904, processor 908, cores 914A and 914B, I/O controller 910, CPU memory controller 912, storage device 906, system memory 907, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification. Example 1 is at least one machine readable storage medium having instructions stored thereon, the instructions when executed by a machine to cause the machine to identify a plurality of non-overlapping coarse domains of a region of interest; select a subset of the plurality of coarse domains based on a plurality of first diversity metrics determined for the plurality of coarse domains, wherein each first diversity metric represents a measure of a diversity of values of at least one metric type for one of the plurality of coarse domains; identify a plurality of non-overlapping fine domains of the region of interest, wherein each of the fine domains is a portion of one of the coarse domains of the selected subset of the plurality of coarse domains; select a subset of the plurality of fine domains based on a plurality of second diversity metrics determined for the plurality of coarse domains, wherein each second diversity metric represents a measure of the diversity of values of the at least one metric type for one of the plurality of fine domains; and provide an indication of the selected subset of the plurality of fine domains.

Example 2 may include the subject matter of example 1, wherein the region of interest comprises one or more layers of a semiconductor chip as represented in a layout database file.

Example 3 may include the subject matter of any of examples 1-2, wherein providing an indication of the selected subset of the plurality of fine domains comprises providing the indication to an imaging tool for capture of a plurality of images corresponding to the selected subset of the plurality of fine domains.

Example 4 may include the subject matter of any of examples 1-3, wherein the instructions when executed by the machine are to cause the machine to select the subset of the plurality of fine domains based on a budget that defines at least one of an upper limit on the number of fine domains that may be selected; or an amount of diversity for the subset of the plurality of fine domains.

Example 5 may include the subject matter of any of examples 1-4, wherein the instructions when executed by the machine are to cause the machine to, responsive to selection of a first fine domain for inclusion in the subset of the plurality of fine domains, adjust the budget to account for values of the at least one metric type for the selected first fine domain.

Example 6 may include the subject matter of any of examples 1-5, wherein the at least one metric type comprises critical dimensions of at least one polygon.

Example 7 may include the subject matter of any of examples 1-6, wherein the at least one metric type comprises densities of windows surrounding at least one anchor polygon.

Example 8 may include the subject matter of any of examples 1-7, wherein the at least one metric type comprises neighborhood geometric patterns relative to at least one anchor polygon.

Example 9 may include the subject matter of any of examples 1-8, wherein selecting the subset of the plurality of fine domains comprises selecting one or more of the fine domains based on a diversity of values of a first metric type of the at least one metric type and subsequently selecting one or more additional fine domains based on a diversity of values of a second metric type of the at least one metric type.

Example 10 may include the subject matter of any of examples 1-9, wherein the measure of the diversity of values of the at least one metric type for one of the plurality of fine domains is based at least in part on a histogram comprising counts for different values of the at least one metric type for the one of the plurality of fine domains.

Example 11 is A method comprising identifying a plurality of non-overlapping coarse domains of a region of interest; selecting a subset of the plurality of coarse domains based on a plurality of first diversity metrics determined for the plurality of coarse domains, wherein each first diversity metric represents a measure of a diversity of values of at least one metric type for one of the plurality of coarse domains; identifying a plurality of non-overlapping fine domains of the region of interest, wherein each of the fine domains is a portion of one of the coarse domains of the selected subset of the plurality of coarse domains; selecting a subset of the plurality of fine domains based on a plurality of second diversity metrics determined for the plurality of coarse domains, wherein each second diversity metric represents a measure of a diversity of values of the at least one metric type for one of the plurality of fine domains; and providing an indication of the selected subset of the plurality of fine domains.

Example 12 may include the subject matter of example 11, wherein the region of interest comprises one or more layers of a semiconductor chip as represented in a layout database file.

Example 13 may include the subject matter of any of examples 11-12, wherein providing an indication of the selected subset of the plurality of fine domains comprises providing the indication to an imaging tool for capture of a plurality of images corresponding to the selected subset of the plurality of fine domains.

Example 14 may include the subject matter of any of examples 11-13, wherein the method further comprises selecting the subset of the plurality of fine domains based on a budget that defines at least one of an upper limit on the number of fine domains that may be selected; or an amount of diversity for the subset of the plurality of fine domains.

Example 15 may include the subject matter of any of examples 11-14, wherein the method further comprises responsive to selection of a first fine domain for inclusion in the subset of the plurality of fine domains, adjusting the budget to account for values of the at least one metric type for the selected first fine domain.

Example 16 may include the subject matter of any of examples 11-15, wherein the at least one metric type comprises critical dimensions of at least one polygon.

Example 17 may include the subject matter of any of examples 11-16, wherein the at least one metric type comprises densities of windows surrounding at least one anchor polygon.

Example 18 may include the subject matter of any of examples 11-17, wherein the at least one metric type comprises neighborhood geometric patterns relative to at least one anchor polygon.

Example 19 may include the subject matter of any of examples 11-18, wherein selecting the subset of the plurality of fine domains comprises selecting one or more of the fine domains based on a diversity of values of a first metric type of the at least one metric type and subsequently selecting one or more additional fine domains based on a diversity of values of a second metric type of the at least one metric type.

Example 20 may include the subject matter of any of examples 11-19, wherein the measure of the diversity of values of the at least one metric type for one of the plurality of fine domains is based at least in part on a histogram comprising counts for different values of the at least one metric type for the one of the plurality of fine domains.

Example 21 is an apparatus comprising a memory to store an identification of a plurality of non-overlapping coarse domains of a region of interest; and a processor coupled to the memory, the processor to select a subset of the plurality of coarse domains based on a plurality of first diversity metrics determined for the plurality of coarse domains, wherein each first diversity metric represents a measure of a diversity of values of at least one metric type for one of the plurality of coarse domains; identify a plurality of non-overlapping fine domains of the region of interest, wherein each of the fine domains is a portion of one of the coarse domains of the selected subset of the plurality of coarse domains; select a subset of the plurality of fine domains based on a plurality of second diversity metrics determined for the plurality of coarse domains, wherein each second diversity metric represents a measure of a diversity of values of the at least one metric type for one of the plurality of fine domains; and provide an indication of the selected subset of the plurality of fine domains.

Example 22 may include the subject matter of example 21, wherein the region of interest comprises one or more layers of a semiconductor chip as represented in a layout database file.

Example 23 may include the subject matter of any of examples 21-22, wherein providing an indication of the selected subset of the plurality of fine domains comprises providing the indication to an imaging tool for capture of a plurality of images corresponding to the selected subset of the plurality of fine domains.

Example 24 may include the subject matter of any of examples 21-23, wherein the processor is to select the subset of the plurality of fine domains based on a budget that defines at least one of an upper limit on the number of fine domains that may be selected; or an amount of diversity for the subset of the plurality of fine domains.

Example 25 may include the subject matter of any of examples 21-24, wherein the processor is to, responsive to selection of a first fine domain for inclusion in the subset of the plurality of fine domains, adjust the budget to account for values of the at least one metric type for the selected first fine domain.

Example 26 may include the subject matter of any of examples 21-25, wherein the at least one metric type comprises critical dimensions of at least one polygon.

Example 27 may include the subject matter of any of examples 21-26, wherein the at least one metric type comprises densities of windows surrounding at least one anchor polygon.

Example 28 may include the subject matter of any of examples 21-27, wherein the at least one metric type comprises neighborhood geometric patterns relative to at least one anchor polygon.

Example 29 may include the subject matter of any of examples 21-28, wherein selecting the subset of the plurality of fine domains comprises selecting one or more of the fine domains based on a diversity of values of a first metric type of the at least one metric type and subsequently selecting one or more additional fine domains based on a diversity of values of a second metric type of the at least one metric type.

Example 30 may include the subject matter of any of examples 21-29, wherein the measure of the diversity of values of the at least one metric type for one of the plurality of fine domains is based at least in part on a histogram comprising counts for different values of the at least one metric type for the one of the plurality of fine domains.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. At least one machine readable storage medium having instructions stored thereon, the instructions when executed by a machine to cause the machine to:
   identify a plurality of non-overlapping coarse domains of a region of interest representing a geographical area;
   select a subset of the plurality of coarse domains based on a plurality of first diversity metrics determined for the plurality of coarse domains, wherein each first diversity metric represents a measure of a diversity of values of at least one metric type for one of the plurality of coarse domains;
   identify a plurality of non-overlapping fine domains of the region of interest, wherein each of the fine domains is a portion of one of the coarse domains of the selected subset of the plurality of coarse domains, wherein fine domains are formed by segmenting coarse domains;
   select a subset of the plurality of fine domains based on a plurality of second diversity metrics determined for the plurality of coarse domains, wherein each second diversity metric represents a measure of the diversity of values of the at least one metric type for one of the plurality of fine domains; and
   provide an indication of the selected subset of the plurality of fine domains.

2. The at least one medium of claim 1, wherein the region of interest comprises one or more layers of a semiconductor chip as represented in a layout database file.

3. The at least one medium of claim 1, wherein providing an indication of the selected subset of the plurality of fine domains comprises providing the indication to an imaging tool for capture of a plurality of images corresponding to the selected subset of the plurality of fine domains.

4. The at least one medium of claim 1, the instructions when executed by the machine to cause the machine to select the subset of the plurality of fine domains based on a budget that defines at least one of:
   an upper limit on the number of fine domains that may be selected; or
   an amount of diversity for the subset of the plurality of fine domains.

5. The at least one medium of claim 1, the instructions when executed by the machine to cause the machine to, responsive to selection of a first fine domain for inclusion in the subset of the plurality of fine domains, adjust the budget to account for values of the at least one metric type for the selected first fine domain.

6. The at least one medium of claim 1, wherein the at least one metric type comprises critical dimensions of at least one polygon.

7. The at least one medium of claim 1, wherein the at least one metric type comprises densities of windows surrounding at least one anchor polygon.

8. The at least one medium of claim 1, wherein the at least one metric type comprises neighborhood geometric patterns relative to at least one anchor polygon.

9. The at least one medium of claim 1, wherein selecting the subset of the plurality of fine domains comprises selecting one or more of the fine domains based on a diversity of values of a first metric type of the at least one metric type and subsequently selecting one or more additional fine domains based on a diversity of values of a second metric type of the at least one metric type.

10. The at least one medium of claim 1, wherein the measure of the diversity of values of the at least one metric type for one of the plurality of fine domains is based at least in part on a histogram comprising counts for different values of the at least one metric type for the one of the plurality of fine domains.

11. A method comprising:
    identifying a plurality of non-overlapping coarse domains of a region of interest representing a geographical area;
    selecting a subset of the plurality of coarse domains based on a plurality of first diversity metrics determined for the plurality of coarse domains, wherein each first diversity metric represents a measure of a diversity of values of at least one metric type for one of the plurality of coarse domains;
    identifying a plurality of non-overlapping fine domains of the region of interest, wherein each of the fine domains is a portion of one of the coarse domains of the selected subset of the plurality of coarse domains, wherein fine domains are formed by segmenting coarse domains;
    selecting a subset of the plurality of fine domains based on a plurality of second diversity metrics determined for the plurality of coarse domains, wherein each second diversity metric represents a measure of a diversity of values of the at least one metric type for one of the plurality of fine domains; and
    providing an indication of the selected subset of the plurality of fine domains.

12. The method of claim 11, wherein the region of interest comprises one or more layers of a semiconductor chip as represented in a layout database file.

13. The method of claim 11, further comprising selecting the subset of the plurality of fine domains based on a budget that defines at least one of:
    an upper limit on the number of fine domains that may be selected; or
    an amount of diversity for the subset of the plurality of fine domains.

14. The method of claim 13, further comprising, responsive to a selection of a first fine domain for inclusion in the subset of the plurality of fine domains, adjusting the budget to account for values of the at least one metric type for the selected first fine domain.

15. The method of claim 11, wherein selecting a subset of the plurality of fine domains comprises selecting one or more of the fine domains based on diversity of values of a first metric type of the at least one metric type and subsequently selecting one or more additional fine domains based on diversity of values of a second metric type of the at least one metric type.

16. An apparatus comprising:
  a memory to store an identification of a plurality of non-overlapping coarse domains of a region of interest representing a geographical area; and
  a processor coupled to the memory, the processor to:
    select a subset of the plurality of coarse domains based on a plurality of first diversity metrics determined for the plurality of coarse domains, wherein each first diversity metric represents a measure of a diversity of values of at least one metric type for one of the plurality of coarse domains;
    identify a plurality of non-overlapping fine domains of the region of interest, wherein each of the fine domains is a portion of one of the coarse domains of the selected subset of the plurality of coarse domains, wherein fine domains are formed by segmenting coarse domains;
    select a subset of the plurality of fine domains based on a plurality of second diversity metrics determined for the plurality of coarse domains, wherein each second diversity metric represents a measure of a diversity of values of the at least one metric type for one of the plurality of fine domains; and
    provide an indication of the selected subset of the plurality of fine domains.

17. The apparatus of claim 16, wherein the region of interest comprises one or more layers of a semiconductor chip as represented in a layout database file.

18. The apparatus of claim 16, wherein the processor is further to select the subset of the plurality of fine domains based on a budget that defines at least one of:
  an upper limit on the number of fine domains that may be selected; or
  an amount of diversity for the subset of the plurality of fine domains.

19. The apparatus of claim 16, further comprising an imaging tool to capture images corresponding to the selected subset of the plurality of fine domains.

20. The apparatus of claim 16, further comprising one or more of a battery communicatively coupled to the processor, a display communicatively coupled to the processor, or a network interface communicatively coupled to the processor.

* * * * *